United States Patent
Chang et al.

(10) Patent No.: US 11,145,510 B2
(45) Date of Patent: Oct. 12, 2021

(54) FINFET DEVICE OVER CONVEX INSULATING STRUCTURE

(71) Applicant: TAIWAN SEMICONDUCTOR MANUFACTURING CO., LTD., Hsinchu (TW)

(72) Inventors: Che-Cheng Chang, New Taipei (TW); Po-Chi Wu, Zhubei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/666,218

(22) Filed: Oct. 28, 2019

(65) Prior Publication Data
US 2020/0066530 A1     Feb. 27, 2020

Related U.S. Application Data

(60) Continuation of application No. 15/715,762, filed on Sep. 26, 2017, now Pat. No. 10,460,942, which is a
(Continued)

(51) Int. Cl.
*H01L 27/12* (2006.01)
*H01L 29/06* (2006.01)
(Continued)

(52) U.S. Cl.
CPC .. *H01L 21/2253* (2013.01); *H01L 21/823431* (2013.01); *H01L 21/845* (2013.01);
(Continued)

(58) Field of Classification Search
CPC .............. H01L 21/2253; H01L 21/845; H01L 21/823431; H01L 27/1211; H01L 27/0886;
(Continued)

(56) References Cited

U.S. PATENT DOCUMENTS 6,188,106 B1   2/2001  Gardner
8,580,642 B1  11/2013  Maszara et al.
(Continued)

FOREIGN PATENT DOCUMENTS

CN   101840884 A   9/2010
CN   102054741 A   5/2011
(Continued)

*Primary Examiner* — Stephen M Bradley
*Assistant Examiner* — Gustavo G Ramallo
(74) *Attorney, Agent, or Firm* — Maschoff Brennan

(57) ABSTRACT

A semiconductor device includes a substrate, a FinFET, and an insulating structure. The FinFET includes a fin, a gate electrode, and a gate dielectric layer. The fin is over the substrate. The gate electrode is over the fin. The gate dielectric layer is between the gate electrode and the fin. The insulating structure is over the substrate, adjacent the fin, and has a top surface lower than a top surface of the fin. The top surface of the insulating structure has opposite first and second edge portions and an intermediate portion between the first and second edge portions. The first edge portion of the top surface of the insulating structure is lower than the intermediate portion of the top surface of the insulating structure.

20 Claims, 16 Drawing Sheets

Related U.S. Application Data division of application No. 14/984,555, filed on Dec. 30, 2015, now Pat. No. 9,786,505.

(51) Int. Cl.
*H01L 21/225* (2006.01)
*H01L 29/78* (2006.01)
*H01L 29/66* (2006.01)
*H01L 29/36* (2006.01)
*H01L 21/84* (2006.01)
*H01L 21/8234* (2006.01)
*H01L 27/088* (2006.01)

(52) U.S. Cl.
CPC ...... *H01L 27/0886* (2013.01); *H01L 27/1211* (2013.01); *H01L 29/0649* (2013.01); *H01L 29/0688* (2013.01); *H01L 29/36* (2013.01); *H01L 29/66795* (2013.01); *H01L 29/785* (2013.01)

(58) Field of Classification Search
CPC .............. H01L 27/0924; H01L 29/785; H01L 29/66795
See application file for complete search history.

(56) References Cited

U.S. PATENT DOCUMENTS

| | | | |
|---|---|---|---|
| 8,883,585 B1 | 11/2014 | Fumitake | |
| 9,356,023 B2 | 5/2016 | Hafez et al. | |
| 9,401,372 B1 | 7/2016 | Doris et al. | |
| 9,559,192 B1* | 1/2017 | Lee | H01L 29/6681 |
| 2004/0048424 A1 | 3/2004 | Wu et al. | |
| 2005/0173768 A1 | 8/2005 | Lee et al. | |
| 2006/0160302 A1 | 9/2006 | Kim et al. | |
| 2010/0240218 A1 | 9/2010 | Ugajin | |
| 2011/0097889 A1* | 4/2011 | Yuan | H01L 21/845 438/595 |
| 2011/0198676 A1 | 8/2011 | Luo | |
| 2012/0299110 A1* | 11/2012 | Hung | H01L 29/66795 257/368 |
| 2013/0037869 A1 | 2/2013 | Okano | |
| 2013/0280883 A1* | 10/2013 | Faul | H01L 21/2255 438/434 |
| 2013/0309838 A1* | 11/2013 | Wei | H01L 21/823821 438/424 |
| 2013/0330889 A1 | 12/2013 | Yin et al. | |
| 2014/0001562 A1* | 1/2014 | Liaw | H01L 21/823821 257/369 |
| 2014/0239404 A1 | 8/2014 | Huang et al. | |
| 2014/0264485 A1 | 9/2014 | Li et al. | |
| 2014/0284723 A1* | 9/2014 | Lee | H01L 21/823821 257/369 |
| 2015/0102392 A1 | 4/2015 | Yu | |
| 2015/0145048 A1* | 5/2015 | Cheng | H01L 27/0924 257/351 |
| 2016/0056045 A1* | 2/2016 | Huang | H01L 21/31138 257/623 |
| 2017/0025536 A1* | 1/2017 | Liang | H01L 29/66545 |

FOREIGN PATENT DOCUMENTS

| | | |
|---|---|---|
| CN | 103474397 A | 12/2013 |
| CN | 104782503 A | 7/2015 |
| TW | 201401513 A | 1/2014 |
| TW | 201507158 A | 2/2015 |

* cited by examiner

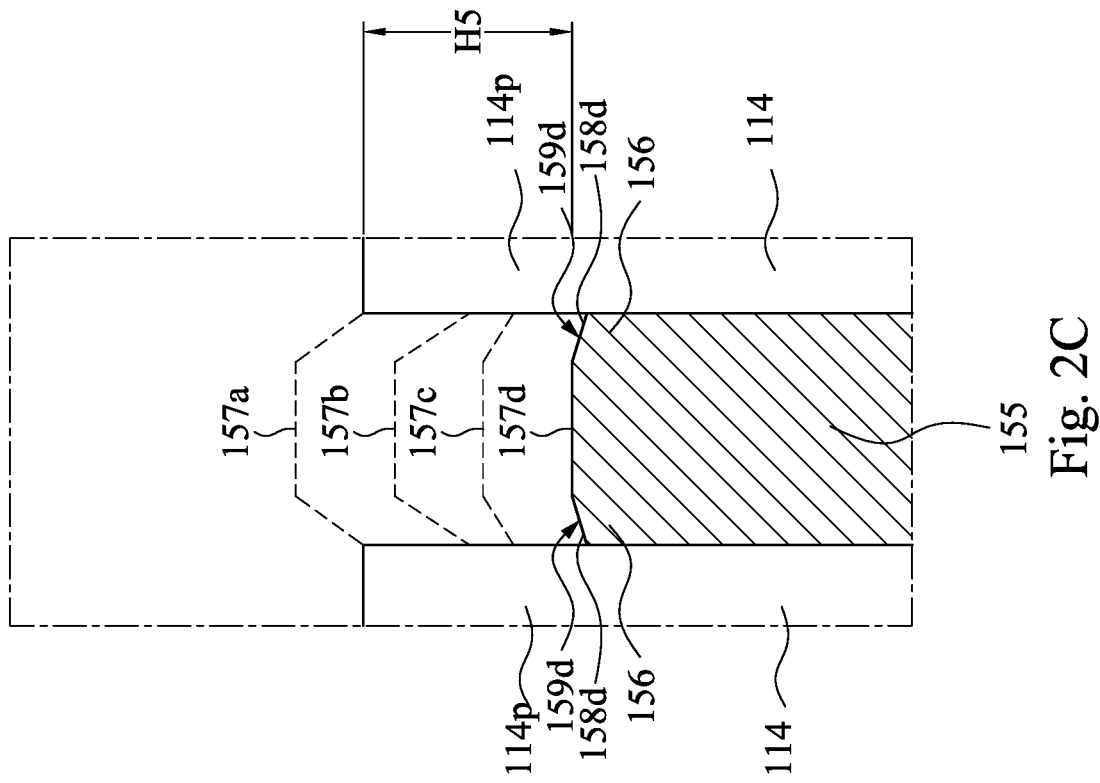
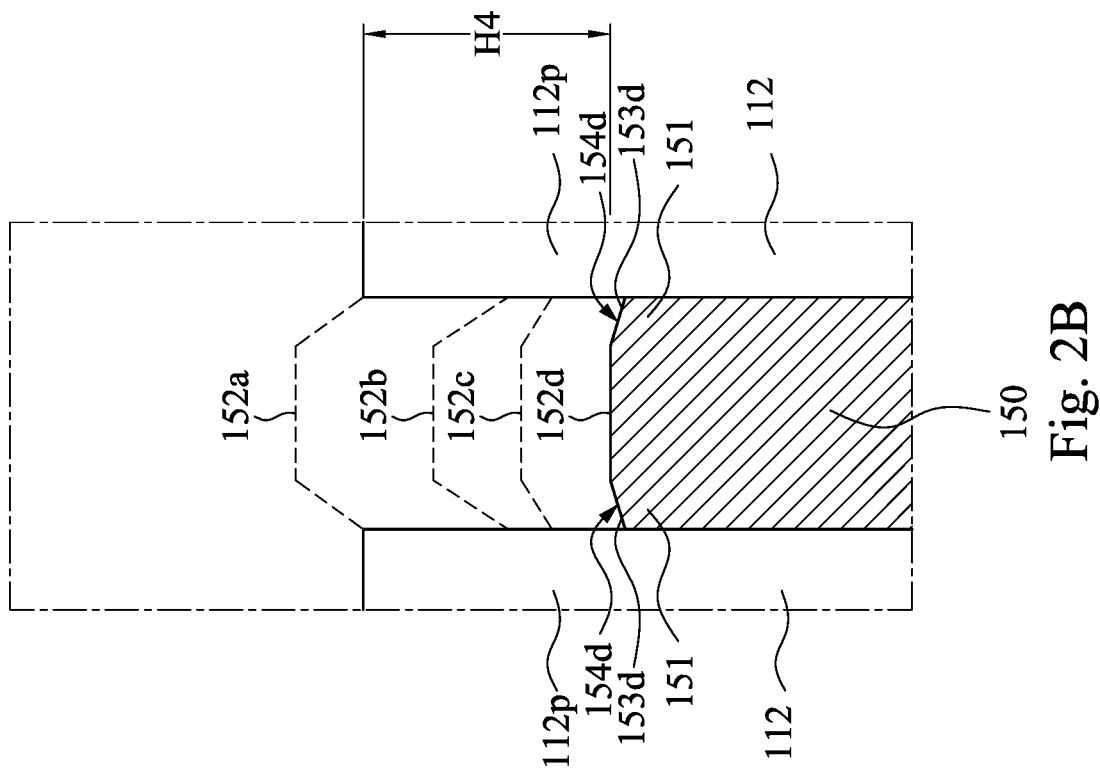

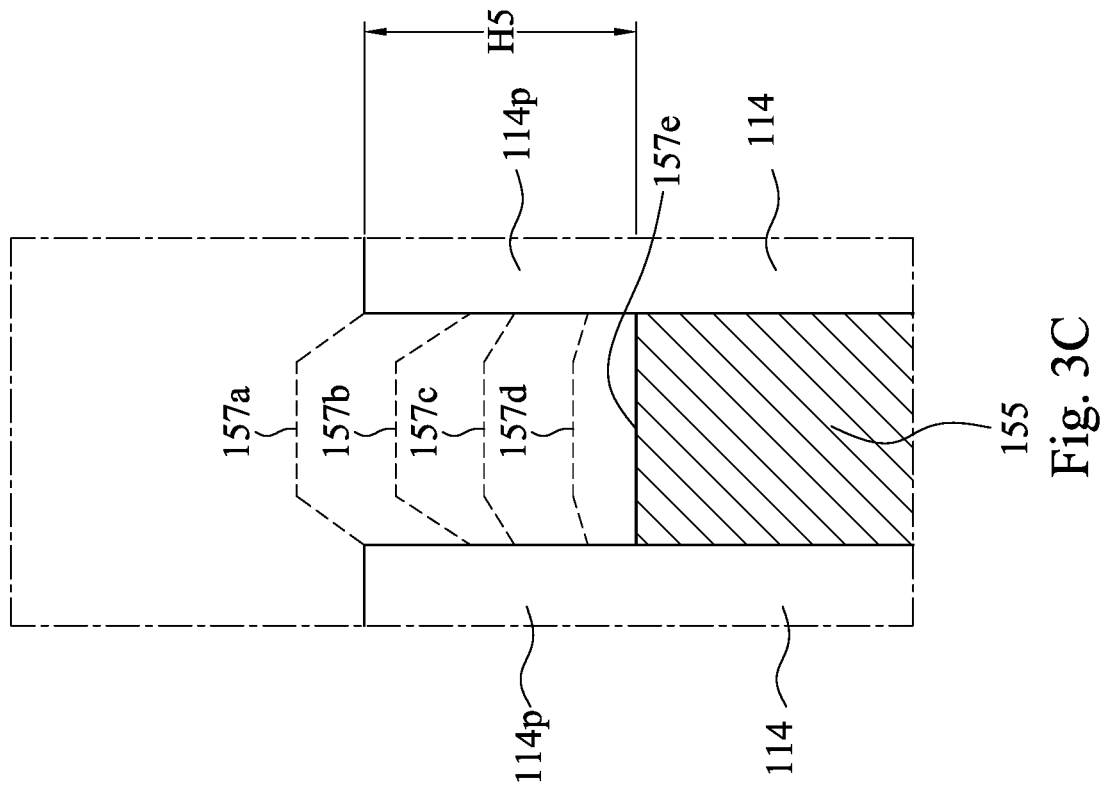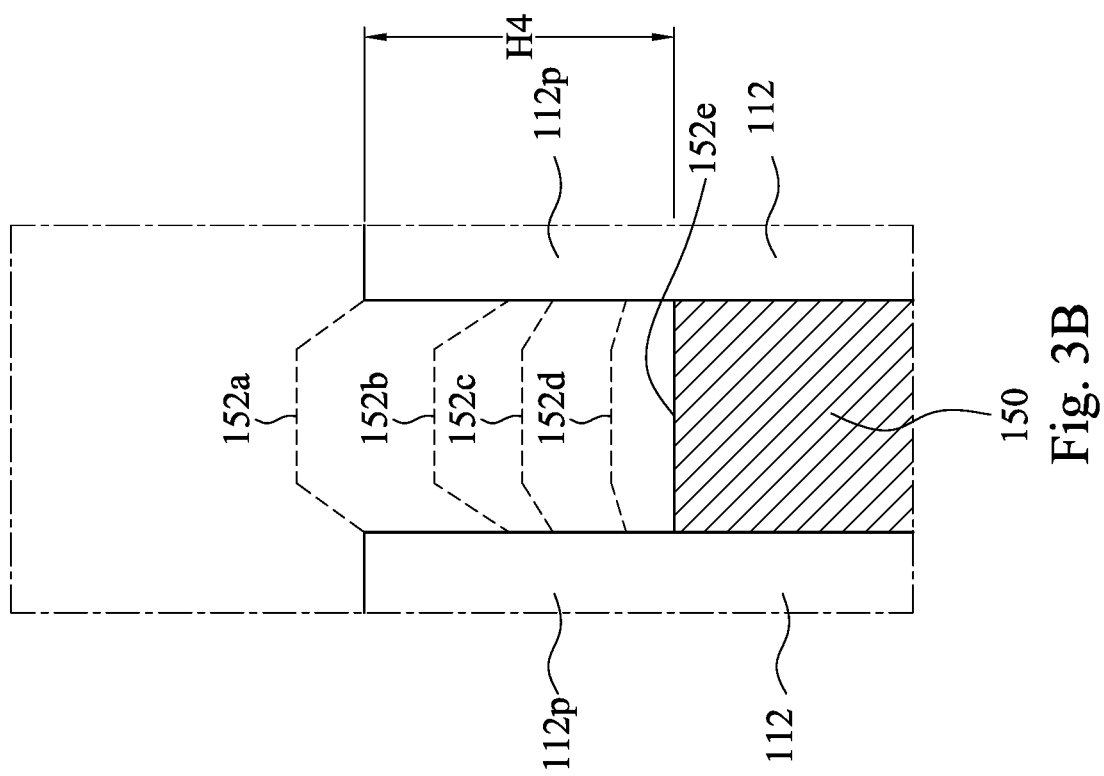

FINFET DEVICE OVER CONVEX INSULATING STRUCTURE

PRIORITY CLAIM AND CROSS-REFERENCE

The present application is a continuation of the application Ser. No. 15/715,762, filed on Sep. 26, 2017, now U.S. Pat. No. 10,460,942, issued on Oct. 29, 2019, which is a divisional of the application Ser. No. 14/984,555, filed on Dec. 30, 2015, now U.S. Pat. No. 9,786,505, issued on Oct. 10, 2017, which are incorporated herein by reference in their entirety.

BACKGROUND

Semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has increased while geometry size (i.e., the smallest component (or line) that can be created using a fabrication process) has decreased. This scaling down process provides increasing production efficiency and lowering associated costs.

Such scaling down has also increased the complexity of processing and manufacturing ICs and similar developments in IC processing and manufacturing are provided. For example, a three dimensional transistor, such as a fin-like field-effect transistor (FinFET), has been introduced to replace a planar transistor. The fin transistor has a channel (referred to as a fin channel) associated with a top surface and opposite sidewalls. The fin channel has a total channel width defined by the top surface and the opposite sidewalls.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is an enlarged view of area B of FIG. 2A.
FIG. 2C is an enlarged view of area C of FIG. 2A.

FIG. 3B is an enlarged view of area B of FIG. 3A.
FIG. 3C is an enlarged view of area C of FIG. 3A.

DETAILED DESCRIPTION

Figure 1A:
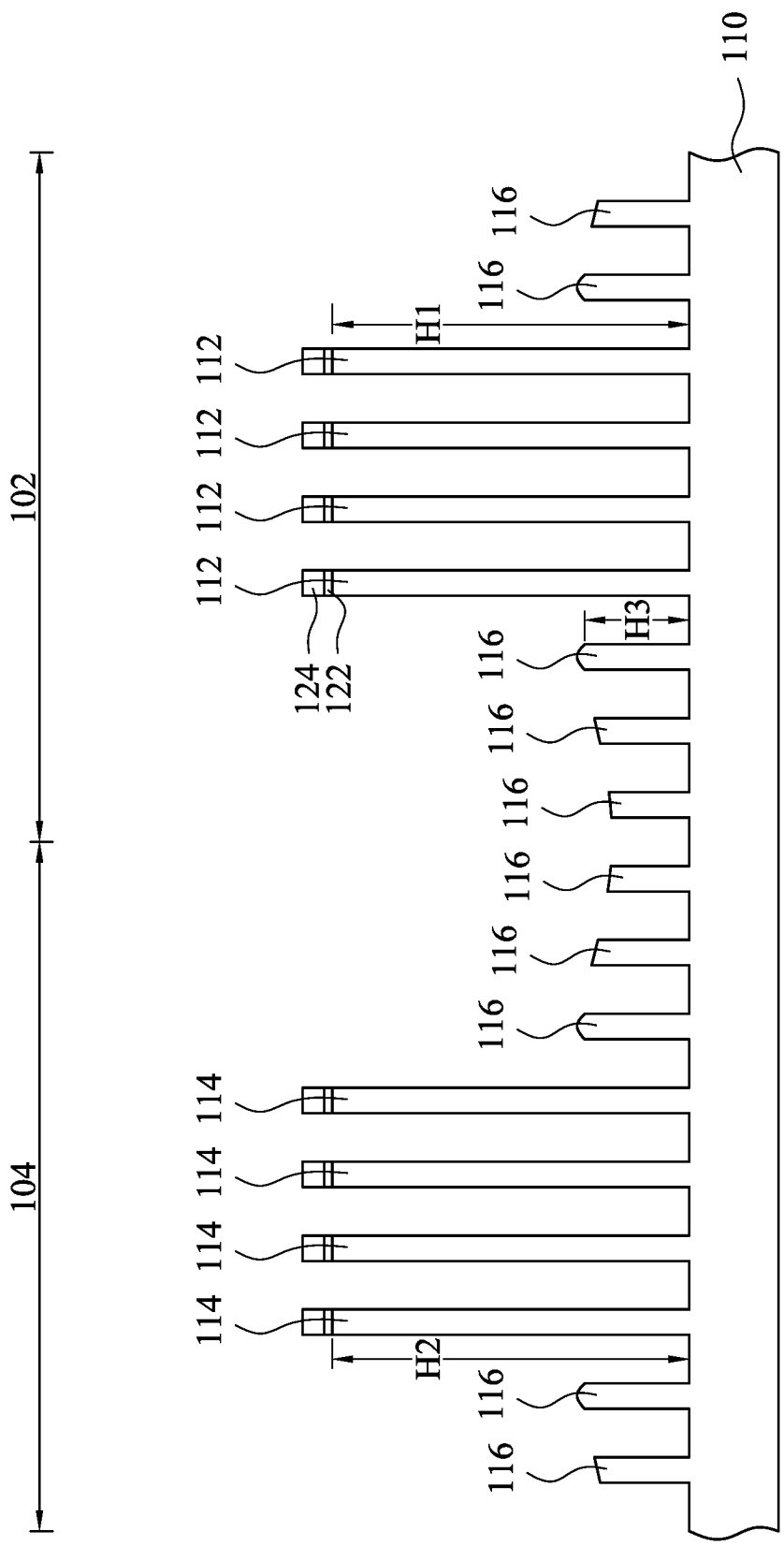
FIGS. 1A to 1L are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Examples of devices that can be improved from one or more embodiments of the present application are semiconductor structures. Such a device, for example, is a Fin field effect transistor (FinFET) device. The FinFET device, for example, may be a complementary metal-oxide-semiconductor (CMOS) device including at least one P-type metal-oxide-semiconductor (PMOS) FinFET device and at least one N-type metal-oxide-semiconductor (NMOS) FinFET device. The following disclosure will continue with a FinFET example to illustrate various embodiments of the present application. It is understood, however, that the application should not be limited to a particular type of device.

FIGS. 1A to 1L are cross-sectional views of a method for manufacturing a semiconductor structure at various stages in accordance with some embodiments of the present disclosure. Reference is made to FIG. 1A. A substrate 110 is provided. The substrate 110 has at least one first region 102 and at least one second region 104. For example, in FIG. 1A, the substrate 110 has one first region 102 and one second region 104 adjacent to the first region 102. In some embodiments, the first region 102 and the second region 104 are different regions selected from the group consisting essentially of a logic core region, a memory region (such as an embedded static random access memory (SRAM) region), an analog region, an input/output (also referred to as a peripheral) region, a dummy region (for forming dummy patterns), and the like. In some embodiments, the first region 102 is an n-type FinFET region, while the second region 104 is a p-type FinFET region, or vise versa. In alternative embodiments, the first region 102 is a logic core region, while the second region 104 is an IO region, or vise versa.

In some embodiments, the substrate 110 includes silicon. Alternatively, the substrate 110 may include germanium, silicon germanium, gallium arsenide or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 110 may include a semiconductor-on-insulator (SOI) structure. Also alternatively, the substrate 110 may include a buried dielectric layer, such as a buried oxide (BOX) layer, such as that formed by separation by implantation of oxygen (SIMOX) technology, wafer bonding, SEG, or other appropriate method.

A plurality of semiconductor fins are formed on the substrate 110. In greater detail, the semiconductor fins includes at least one first active semiconductor fin 112 and at least one second active semiconductor fin 114. For example, in FIG. 1A, there are four of the first active semiconductor fins 112 and four of the second active semiconductor fins 114. The first active semiconductor fins 112 are formed on the first region 102 of the substrate 110, and the second active semiconductor fins 114 are formed on the second region 104 of the substrate 110. In some embodiments, the first active semiconductor fins 112 and the second active semiconductor fins 114 include silicon. It is note that the numbers of the first active semiconductor fins 112 and the second active semiconductor fins 114 in FIG. 1A are illustrative, and should not limit the claimed scope of the present disclosure. A person having ordinary skill in the art may select suitable numbers for the first active semiconductor fins 112 and the second active semiconductor fins 114 according to actual situations.

The first active semiconductor fins 112 and the second active semiconductor fins 114 may be formed, for example, by patterning and etching the substrate 110 using photolithography techniques. In some embodiments, a pad layer 122, a mask layer 124, and a layer of photoresist material (not shown) are sequentially deposited over the substrate 110. The layer of photoresist material is irradiated (exposed) in accordance with a desired pattern (the first active semiconductor fins 112 and the second active semiconductor fins 114 in this case) and developed to remove portions of the photoresist material, the mask layer 124, and the pad layer 122. The remaining photoresist material, the mask layer 124, and the pad layer 122 protect the underlying material from subsequent processing steps, such as etching. It should be noted that other masks, such as an oxide or silicon nitride mask, may also be used in the etching process. In some embodiments, the pad layer 122 may be a silicon oxide layer, and the mask layer 124 may be a silicon nitride layer.

In some embodiments, at least one dummy semiconductor fin 116 is formed on the substrate 110. For example, in FIG. 1A, there are ten dummy semiconductor fins 116. The dummy semiconductor fins 116 can be disposed in the first region 102 and/or the second region 104 of the substrate 110, and can be disposed between the first active semiconductor fins 112 and the second active semiconductor fins 114. The dummy semiconductor fins 116 have no functionality in the semiconductor structure but make the device processes more uniform, more reproducible, and more manufacturable. The first active semiconductor fins 112 and the second active semiconductor fins 114 have functionality in the semiconductor structure.

The dummy semiconductor fins 116 can be formed with the first active semiconductor fins 112 and the second active semiconductor fins 114. In greater detail, a plurality of semiconductor fins with substantially equal spaced and substantially the same height are formed on the substrate 110 in advanced. Additional lithography and etch operations are performed to remove (or cut) some of the fins, referred to as the dummy semiconductor fins 116. The lithography and etch operation can be performed once or multiple times. The uncut semiconductor fins are referred to as the first active semiconductor fins 112 and the second active semiconductor fins 114. That is, the heights H1 of the first active semiconductor fins 112 and the heights H2 of the second active semiconductor fins 114 are greater than the heights H3 of the dummy semiconductor fins 116. This operation can prevent different fin line profile including both critical dimensions and sidewall profile angle. However, in some other embodiments, the dummy semiconductor fins 116 can be omitted. In some embodiments, the first active semiconductor fin 112 and the second active semiconductor fin 114 have substantially the same height from the substrate 110, i.e., the height H1 is substantially equal to the height H2, and the heights H1 and/or the heights H2 are about 100 nm to about 160 nm, and the claimed scope is not limited in this respect.

Figure 1B:
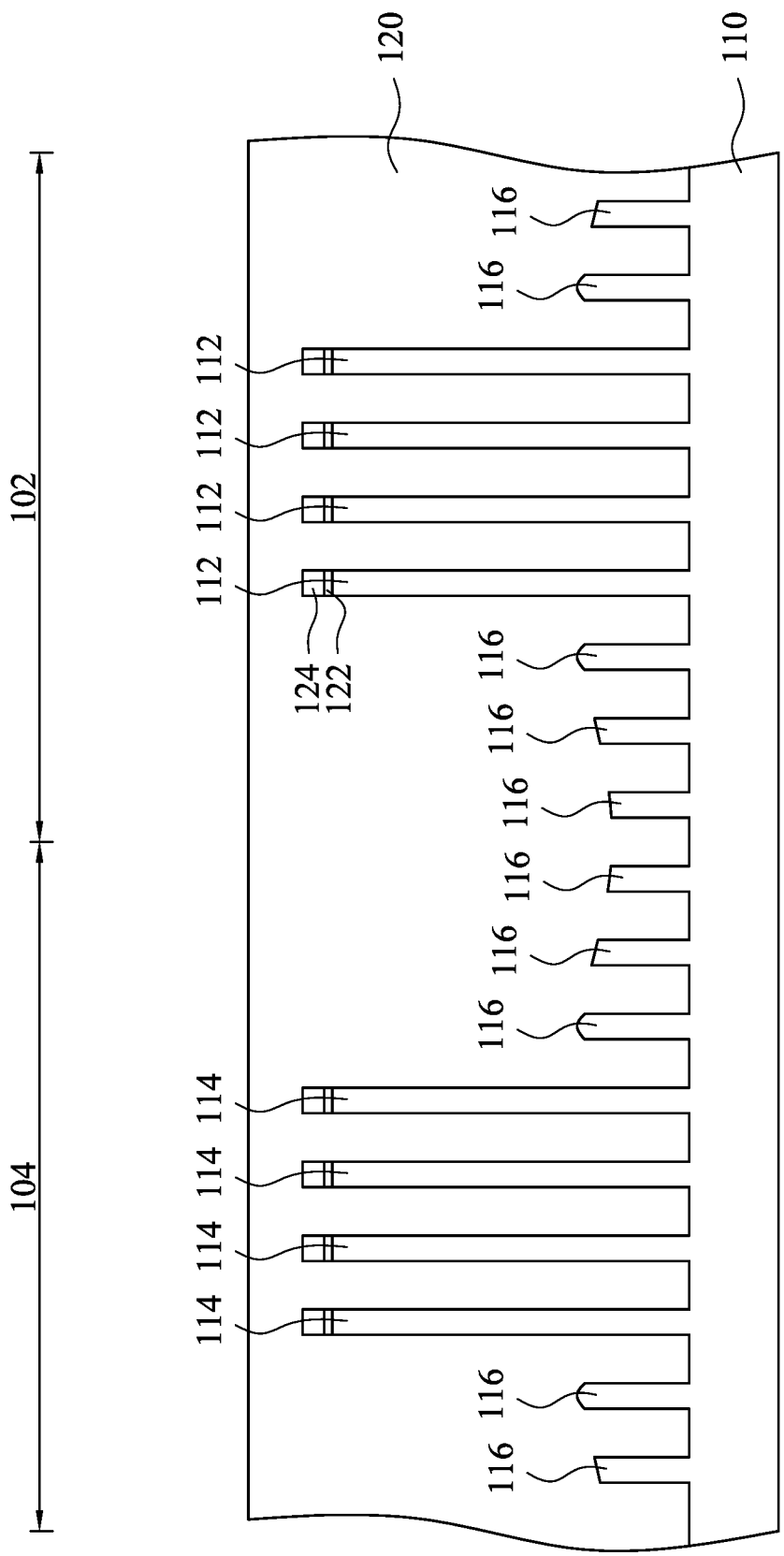

Reference is made to FIG. 1B. Dielectric material 120 is disposed on the substrate 110 and covers the first active semiconductor fins 112, the second active semiconductor fins 114, and the dummy semiconductor fins 116. In some embodiments, the dielectric material 120 includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other commonly used CVD methods. The formation of the liner oxide reduces the electrical fields and hence improves the performance of the resulting semiconductor structure.

Figure 1C:
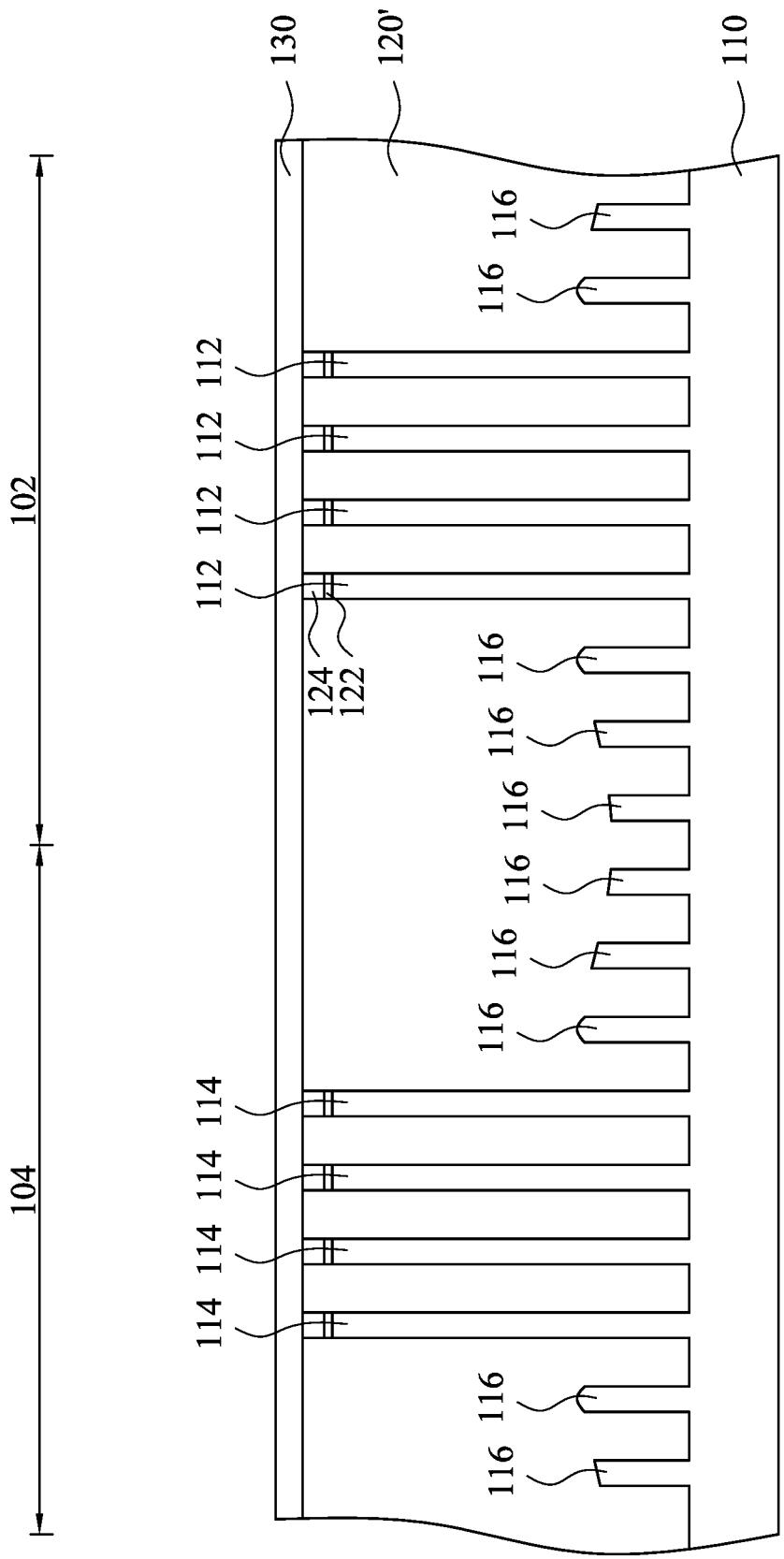

Reference is made to FIG. 1C. A chemical mechanical polish (CMP) is performed to level the top surface of the dielectric material 120 to the top surface of the mask layer 124 to form a dielectric layer 120'. In other words, the dielectric layer 120' covers the dummy semiconductor fins 116. The mask layer 124 may be used as a CMP stop layer.

A protection layer 130 is formed on the dielectric material 120' and covers the first active semiconductor fins 112 and the second active semiconductor fins 114. The protection layer 130 allows implantation therethrough while preventing damage of the underlying structure (i.e., the first active semiconductor fins 112, the second active semiconductor fins 114, and the dielectric material 120'). Examples of a suitable protection layer 130 may be an oxide layer or include a $SiO_2$ or SiN layer deposited by a CVD process, e.g., MOCVD, or an $Al_2O_3$ layer or a nanolaminate layer, including a material such as $HfO_2$ and/or HfAlO, deposited by ALD.

Figure 1D:
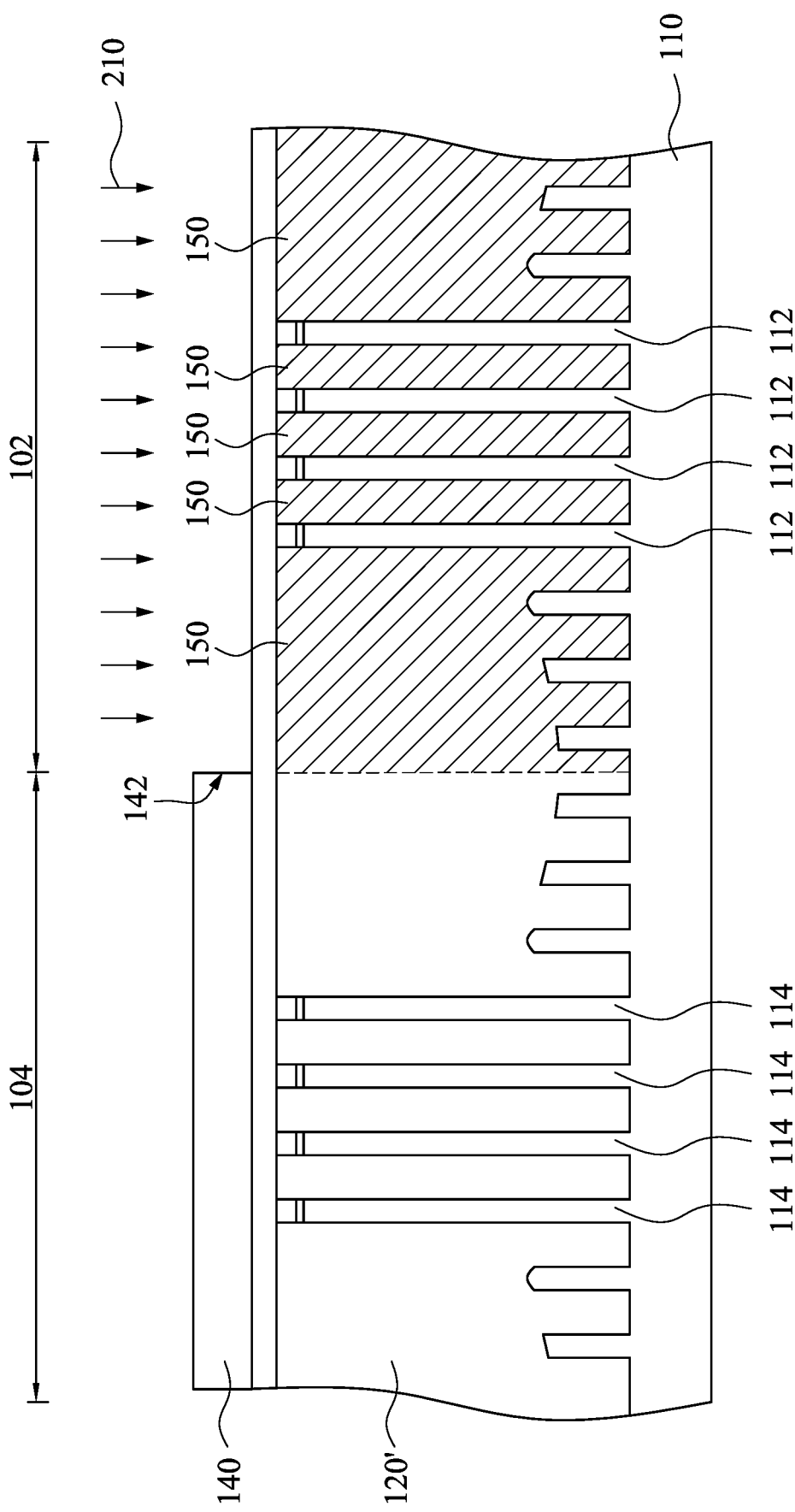

Reference is made to FIG. 1D. A patterned mask layer 140 is formed on the protection layer 130 and the second region 104 of the substrate 110. The patterned mask layer 140 can be a resist layer, which is also referred to as a photoresist layer, photosensitive layer, imaging layer, patterning layer, or radiation sensitive layer. The patterned mask layer 140 includes a positive-type resist material, a negative-type resist material, other type material, or combinations thereof. The patterned mask layer 140 is formed on the protection layer 130 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer. In some embodiments, the lithography process implements an etching process, such as a dry etching, wet etching, other etching method, or combinations thereof. A rinsing process, such as a de-ionized (DI) water rinse, may be performed on the protection layer 130 before forming the patterned mask layer 140.

The patterned mask layer 140 includes an opening 142 that exposes a portion of the protection layer 130 located on the first region 102 of the substrate 110. In FIG. 1D, an ion implantation process (or doping process) 210 is performed on the dielectric layer 120' using the patterned mask layer 140 as a mask. In FIG. 1D, the ion implantation process 210 forms at least one first insulating structure 150 in the dielectric layer 120'. The ion implantation process 210 implants p-type dopants (such as boron (B), indium (In), aluminum (Al), gallium (Ga), IIIA group elements, or combinations thereof). In some embodiments, the first insulating structure 150 is an electrically isolation between semiconductor fins of a semiconductor structure, such as a transistor. The ion implantation process 210 is performed at a suitable energy and dosage to achieve desired characteristics of the semiconductor structure. In some embodiments, the implant dosage of the ion implantation process 210 is about $8 \times 10^{12}$ ions/cm$^2$ to about $2 \times 10^{14}$ ions/cm$^2$, and the energy of the ion implantation process 210 is about 20 keV to about 120 keV, and the claimed scope is not limited in the respect.

Figure 1E:
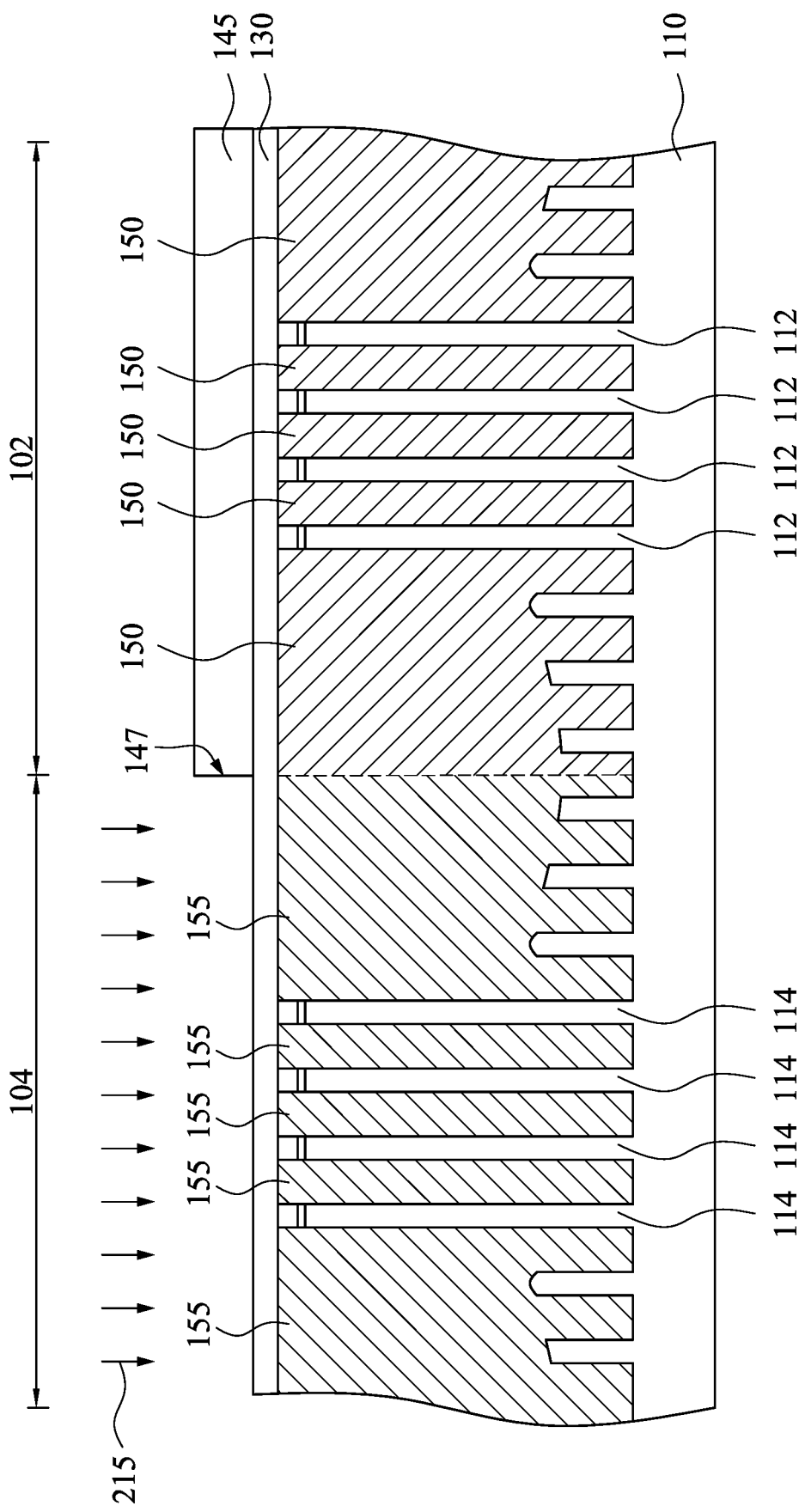

Reference is made to FIG. 1E. The patterned mask layer 140 (see FIG. 1D) is removed. In some embodiments, the patterned mask layer 140 is removed by performing a wet etching process. In some embodiments, wet etch solution for the wet etching process includes sulfuric acid (H$_2$SO$_4$) and peroxide (H$_2$O$_2$). Alternatively, the patterned mask layer 140 is removed by a chemical solution selected from O$_3$ water, sulfuric acid (H$_2$SO$_4$) and ozone (O$_3$), H$_2$SO$_4$ and H$_2$O$_2$, N-methyl-2-pyrrolidine (NMP), cyclohexanol, cyclopentanol, propylene glycol monomethyl ether (PGME), and Propylene glycol monomethyl ether acetate (PGMEA). In some other embodiment, the patterned mask layer 140 is removed by a chemical solution selected from oxidant based solution. In some embodiments, a cleaning process is performed to clean organic residue or other residues after the removal of the patterned mask layer 140. The cleaning material is capable of removing the organic residue. The cleaning material may include solvent, surfactant or polymer ingredient.

Another patterned mask layer 145 is formed on the protection layer 130 and the first region 102 of the substrate 110. The patterned mask layer 145 can be a resist layer, which is also referred to as a photoresist layer, photosensitive layer, imaging layer, patterning layer, or radiation sensitive layer. The patterned mask layer 145 includes a positive-type resist material, a negative-type resist material, other type material, or combinations thereof. The patterned mask layer 145 is formed on the protection layer 130 by a lithography process. The lithography process includes resist coating (for example, spin-on coating), soft baking, mask aligning, exposure, post-exposure baking, developing the resist, rinsing, drying (for example, hard baking), other suitable processes, or combinations thereof. Alternatively, the lithography process is implemented or replaced by other methods, such as maskless lithography, electron-beam writing, or ion-beam writing. In yet another alternative, the lithography process implements nanoimprint technology to pattern the mask layer. In some embodiments, the lithography process implements an etching process, such as a dry etching, wet etching, other etching method, or combinations thereof. A rinsing process, such as a de-ionized (DI) water rinse, may be performed on the protection layer 130 before forming the patterned mask layer 145.

The patterned mask layer 145 includes an opening 147 that exposes a portion of the protection layer 130 located on the second region 104 of the substrate 110. In FIG. 1E, another ion implantation process (or doping process) 215 is performed on the dielectric layer 120' using the patterned mask layer 145 as a mask. In FIG. 1E, the ion implantation process 215 forms at least one second insulating structure 155 in the dielectric layer 120'. The ion implantation process 215 implants n-type dopants (such as nitrogen (N), phosphor (P), arsenic (As), antimony (Sb), VA group elements, or combinations thereof). In some embodiments, the second insulating structure 155 is an electrically isolation between semiconductor fins of a semiconductor structure, such as a transistor. The ion implantation process 215 is performed at a suitable energy and dosage to achieve desired characteristics of the semiconductor structure. In some embodiments, the implant dosage of the ion implantation process 215 is about $8 \times 10^{12}$ ions/cm$^2$ to about $3 \times 10^{14}$ ions/cm$^2$, and the energy of the ion implantation process 215 is about 20 keV to about 250 keV, and the claimed scope is not limited in the respect.

Figure 1F:
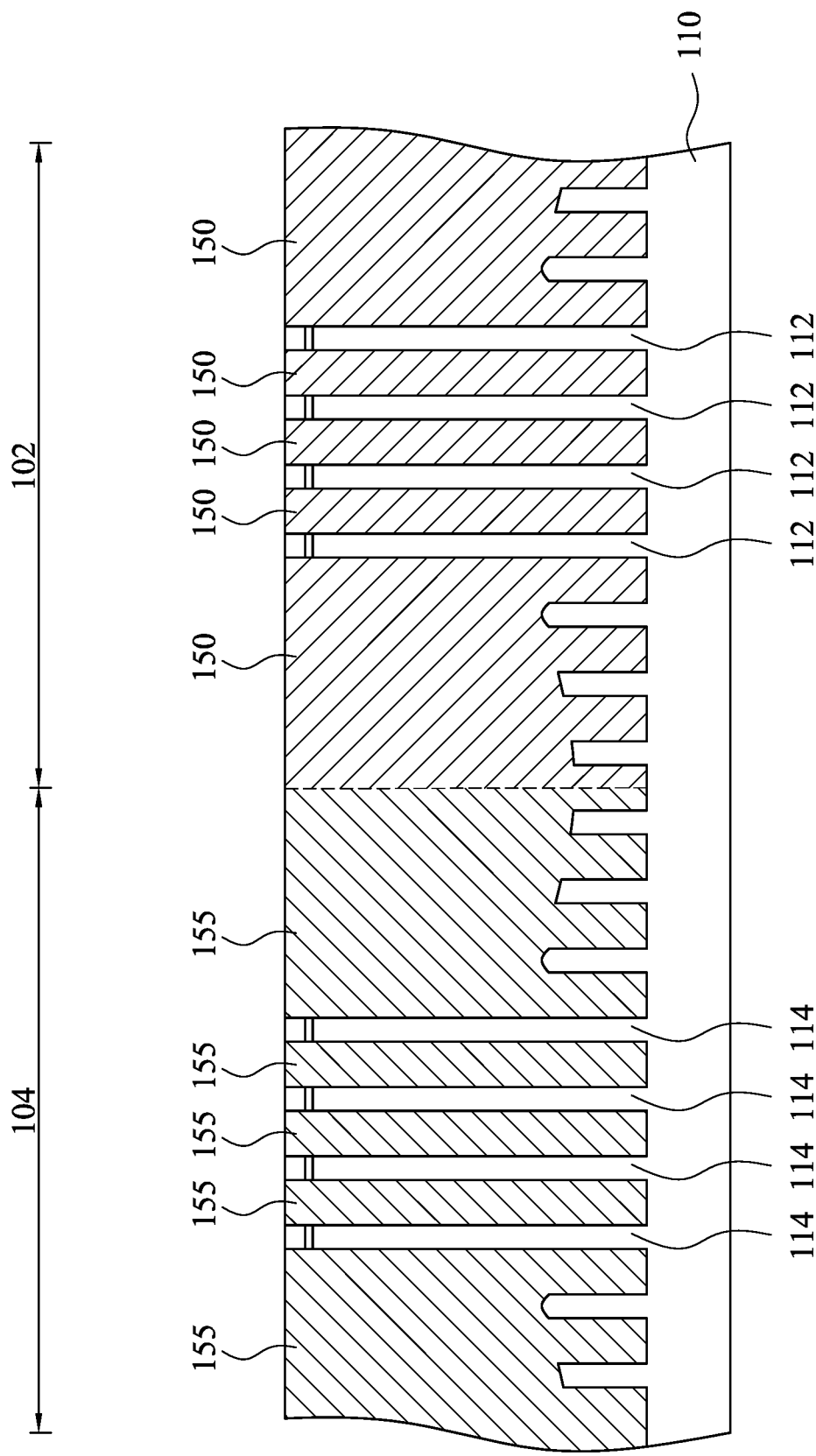

Reference is made to FIG. 1F. The patterned mask layer 145 (see FIG. 1E) and the protection layer 130 (see FIG. 1E) are removed. In some embodiments, the patterned mask layer 145 is removed by performing a wet etching process. In some embodiments, wet etch solution for the wet etching process includes sulfuric acid (H$_2$SO$_4$) and peroxide (H$_2$O$_2$). Alternatively, the patterned mask layer 140 is removed by a chemical solution selected from O$_3$ water, sulfuric acid (H$_2$SO$_4$) and ozone (O$_3$), H$_2$SO$_4$ and H$_2$O$_2$, N-methyl-2-pyrrolidine (NMP), cyclohexanol, cyclopentanol, propylene glycol monomethyl ether (PGME), and Propylene glycol monomethyl ether acetate (PGMEA). In some other embodiment, the patterned mask layer 145 is removed by a chemical solution selected from oxidant based solution. In some embodiments, a cleaning process is performed to clean organic residue or other residues after the removal of the patterned mask layer 145. The cleaning material is capable of removing the organic residue. The cleaning material may include solvent, surfactant or polymer ingredient.

In some embodiments, an annealing (referred to as diffusion annealing hereinafter) process can be performed after the patterned mask layer 145 is removed. The annealing process is to force the dopants in the first insulating structures 150 and the second insulating structures 155 to diffuse. The diffusion annealing may include rapid thermal anneal (RTA) and/or solid phase epitaxy re-growth anneal. As a result of the diffusion annealing, the first insulating structures 140 and the second insulating structures 145 have much uniform dopant distributions.

Figure 1G:
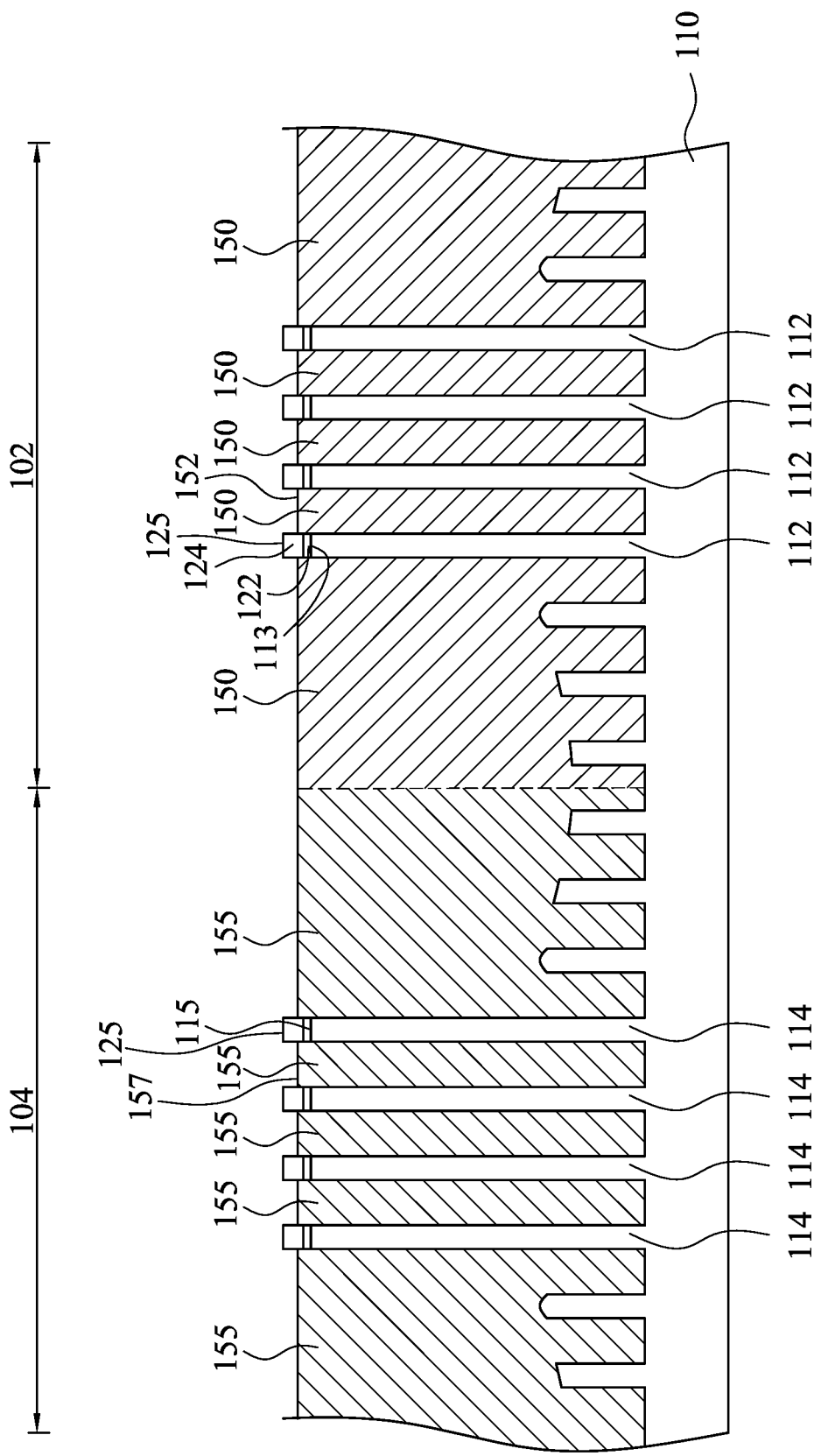

Reference is made to FIG. 1G. The first insulating structures 150 and the second insulating structures 155 are recessed to expose portions of the mask layer 124. In some embodiments, the recessing of the first insulating structures 150 and the second insulating structures 155 includes a wet dip, for example, in a diluted hydrofluoric (HF) acid solution, which may have an HF concentration lower than about 1 percent. In alternative embodiments, the etching is a dry etching, in which the process gases including NH$_3$ and HF are used. In FIG. 1G, the first insulating structures 150 and the second insulating structures 155 are recessed, such that the mask layer 124 protrudes from the first insulating structures 150 and the second insulating structures 155 while the first active semiconductor fins 112 and the active second semiconductor fins 114 are embedded therein. That is, the top surfaces 152 of the first insulating structures 150 are lower than the top surface 125 of the mask layer 124 and higher than the top surfaces 113 of the first active semiconductor fins 112. Also, the top surfaces 157 of the second insulating structures 155 are lower than the top surface 125 of the mask layer 124 and higher than the top surfaces 115 of the second active semiconductor fins 114.

Figure 1H:
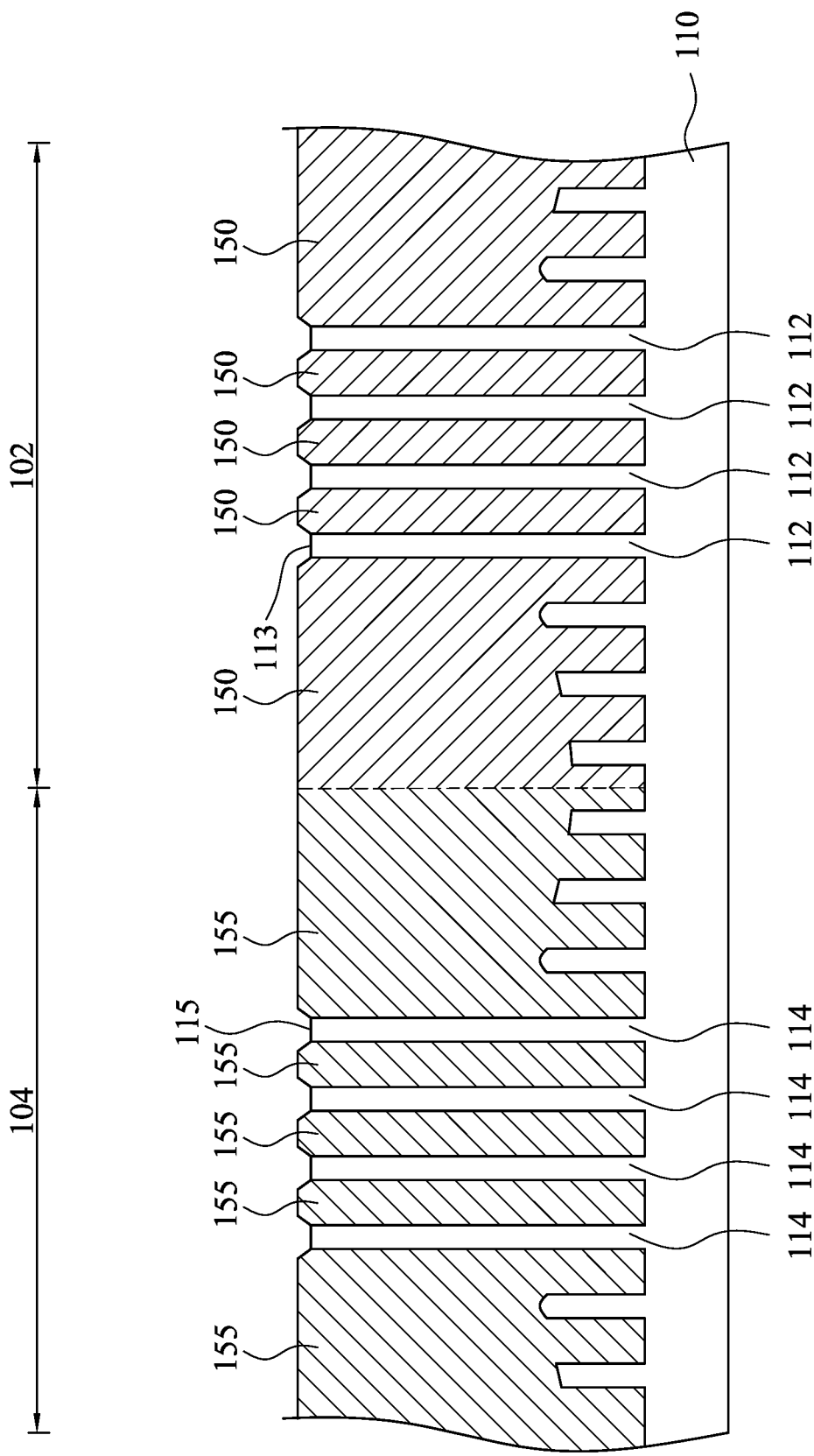

Reference is made to FIG. 1H. The mask layer 124 and the pad layer 122 (see FIG. 1G) are removed or etched. In some embodiments, the mask layer 124 may be removed by a wet process using hot $H_3PO_4$, and the pad layer 122 may be removed using diluted HF acid. Therefore, the top surfaces 113 of the first active semiconductor fins 112 and the top surfaces 115 of the second active semiconductor fins 114 are exposed or uncovered.

Figure 1I:
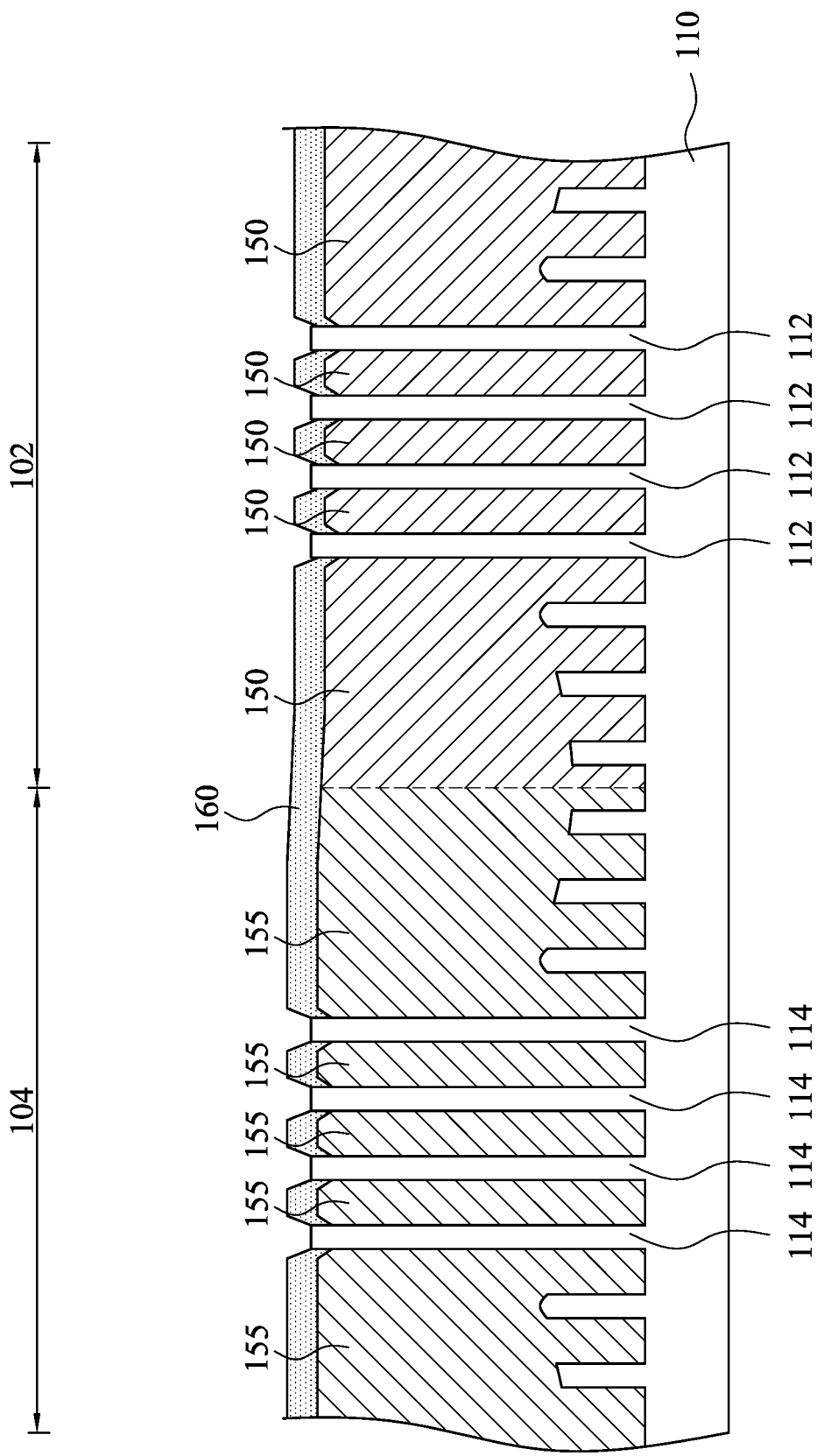

Reference is made to FIG. 1I. At least one sacrificial layer 160 is formed on the first insulating structures 150 and the second insulating structures 155. In some embodiments, hydrogen fluoride (HF) and ammonia ($NH_3$) are introduced as etchants to the first insulating structures 150 and the second insulating structures 155. The HF and $NH_3$ may react with each other and with the oxide present in the first insulating structures 150 and the second insulating structures 155 to produce $(NH_4)_2SiF_6$ on the first insulating structures 150 and the second insulating structures 155 to form the sacrificial layer 160. That is, the sacrificial layer 160 is made of $(NH_4)_2SiF_6$. As the sacrificial layer 160 is formed on the first insulating structures 150 and the second insulating structures 155, the sacrificial layer 160 will act as diffusion barrier layers that will prevent the further diffusion of HF and $NH_3$ into the sacrificial layer 160. In other words, the formation of sacrificial layer 160 will prevent further formation of $(NH_4)_2SiF_6$ at a deeper depth within the first insulating structures 150 and the second insulating structures 155. The depth to which the sacrificial layer 160 will form may be adjusted based on process conditions. Also, the sacrificial layer 160 are substantially uniformly formed. The term "substantially" as used herein may be applied to modify any quantitative representation which could permissibly vary without resulting in a change in the basic function to which it is related.

Figure 1J:
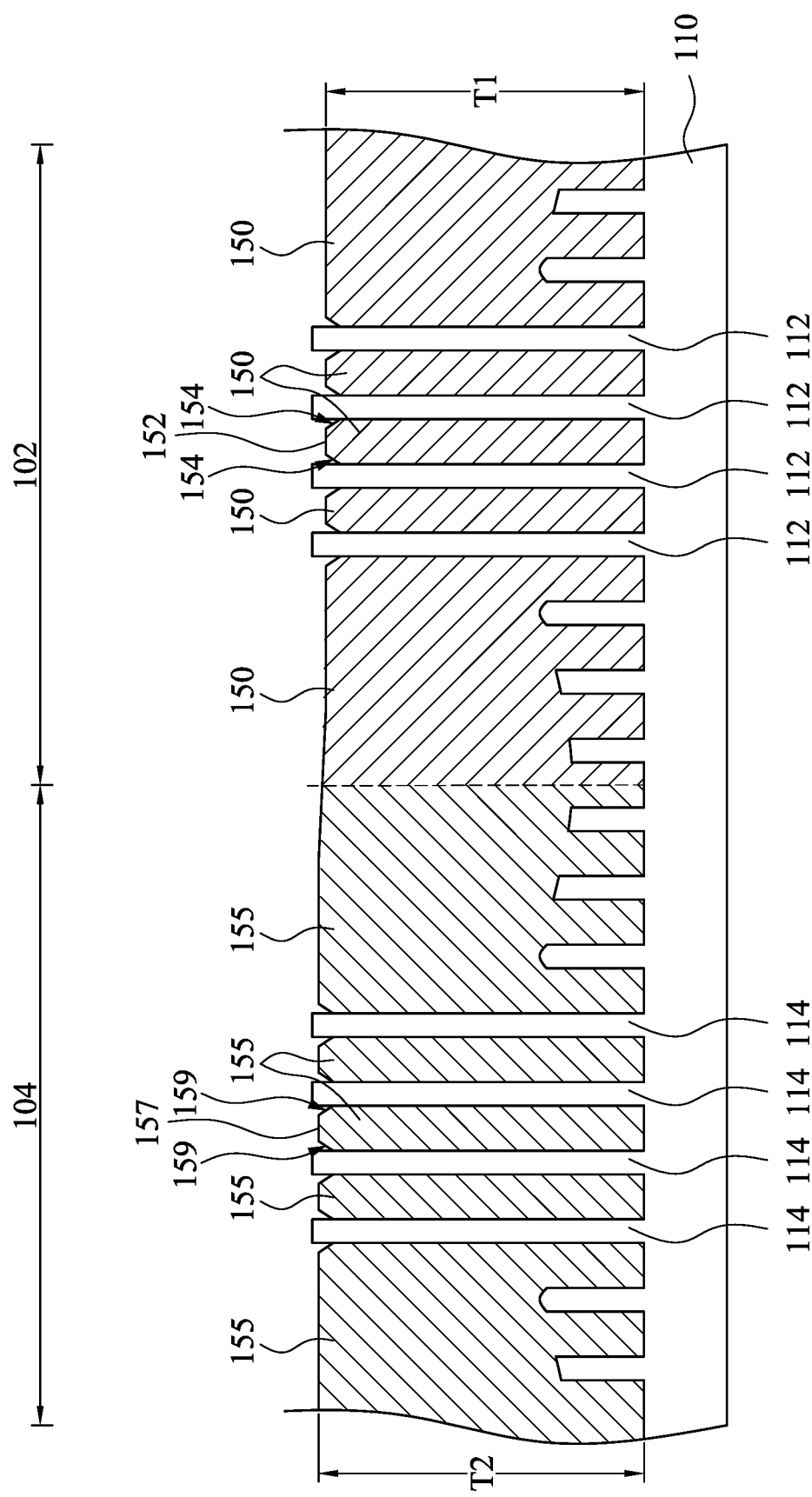

Reference is made to FIG. 1J. Once the reaction has effectively self-terminated, the sacrificial layer 160, the first insulating structures 150 and the second insulating structures 155 (along with the substrate 110) may be heated in order to remove the sacrificial layer 160, thereby reducing the thickness of the first insulating structures 150 and the second insulating structures 155 and exposing a remaining portion of the first insulating structures 150 and the second insulating structures 155 for further processing. The heat may cause the sacrificial layer 160 to thermally decompose to N2, $H_2O$, $SiF_4$, and $NH_3$, all of which may be vapor and may be removed from the first insulating structures 150 and the second insulating structures 155. In some embodiments, by increasing the temperature of the heating can increase the removing (or etching) rate.

In FIG. 1J, since the first insulating structures 150 and the second insulating structures 155 have different dopants, the etching rate of the first insulating structures 150 and the second insulating structures 155 are different. For example, in FIG. 1J, the top surfaces 152 of the first insulating structures 150 is lower than the top surfaces 157 of the second insulating structures 155. In other words, the top surfaces 152 of the first insulating structure 150 and the top surfaces 157 of the second insulating structure 155 are non-coplanar. Therefore, the first insulating structures 150 and the second insulating structures 155 with different thicknesses T1 and T2 can be formed in the same process.

Furthermore, since the sacrificial layer 160 is substantially uniformly formed, the sacrificial layer 160 is substantially uniformly removed. Hence, in FIG. 1J, the middle portions of top surfaces 152 of the first insulating structure 150 are substantially flat. Moreover, at least one recess 154 is formed at an edge of the first insulating structures 150. In FIG. 1J, the top surfaces 152 is convex. Moreover, the middle portion of the top surfaces 157 of the first insulating structure 155 are substantially flat. At least one recess 159 is formed at an edge of the second insulating structures 155. In FIG. 1J, the top surfaces 157 is convex.

Figure 1K:
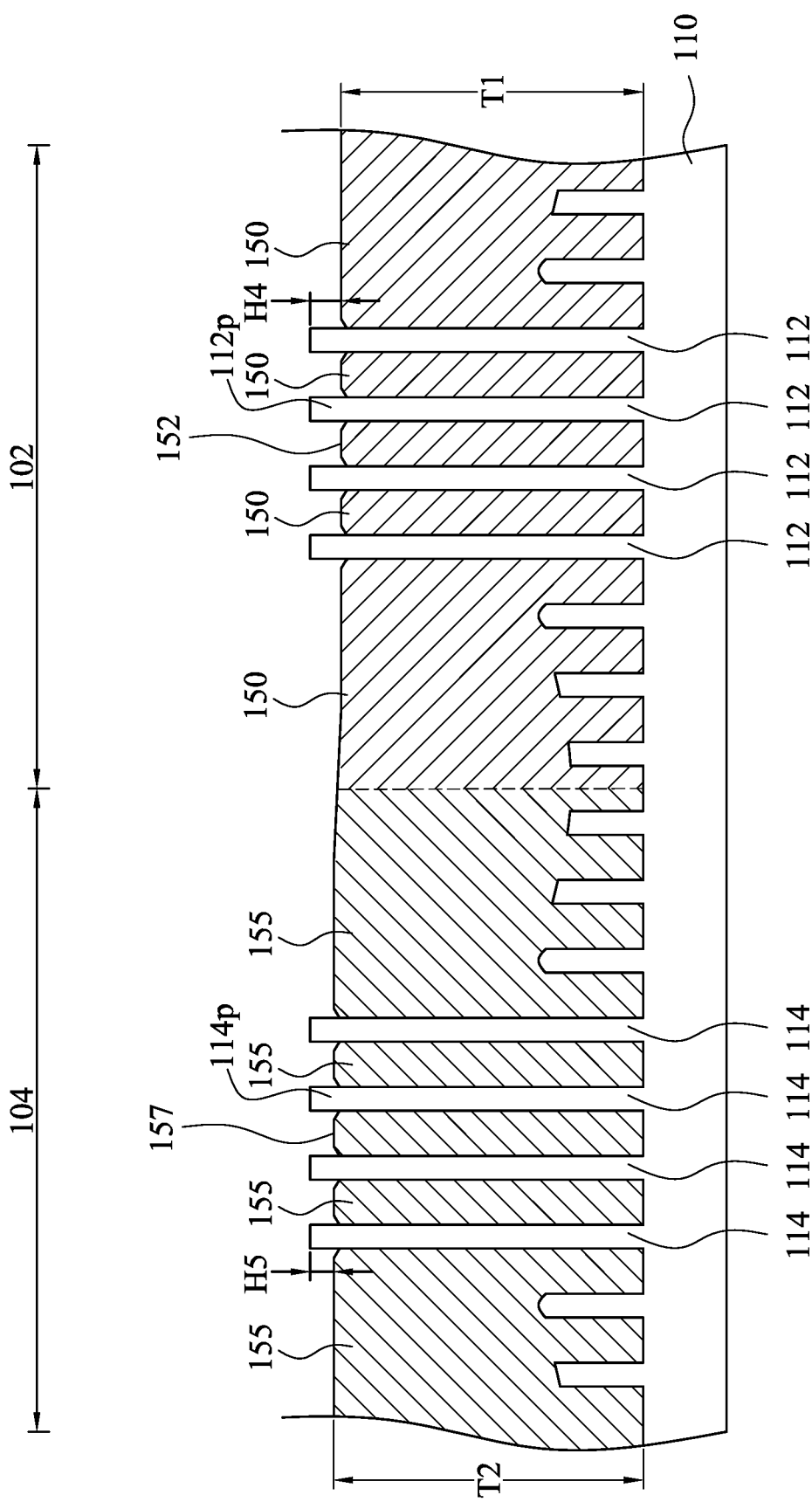

Reference is made to FIG. 1K. After the sacrificial layer 160 (see FIG. 1I) has been removed, the first insulating structures 150 and the second insulating structures 155 are again exposed and may be further processed. In some embodiments, another removing cycle, such as a removing cycle similar to the forming and removing processes described in FIGS. 1I and 1J, may be repeatedly performed to controllably reduce the thicknesses T1 and T2 of the first insulating structures 150 and the second insulating structures 155 even further, such as reducing the first insulating structures 150 and the second insulating structures 155 by another few nm. However, as one of ordinary skill in the art will recognize, the type of the removing cycles, the number of iterations of the removing cycles, the process parameters for the removing cycles, and the thickness of the first insulating structures 150 and the second insulating structures 155 as described above is intended to be illustrative only, as any number of iterations and any desired thickness of the first insulating structures 150 and the second insulating structures 155 may alternatively be utilized.

In FIG. 1K, two removing cycles (i.e., the forming and the removing processes of FIGS. 1I and 1J for one removing cycle) are performed. The first insulating structures 150 and the second insulating structures 155 are further recessed, such that the first active semiconductor fins 112 protrude from the first insulating structures 150 and are referred as protruding portions 112p herein, and the second active semiconductor fins 114 protrude from the second insulating structures 155 and are referred as protruding portions 114p herein. In some embodiments, the protruding portions 112p and 114p can be source/drain features of FinFETs. In some embodiments, the height H4 of the protruding portion 112p of one of the first active semiconductor fins 112 may be about 8 nm, and the height H5 of the protruding portion 114p of one of the second active semiconductor fins 114 may be less than about 8 nm. By increasing the number of the removing cycles, the heights H1 and H2 can be increased. Meanwhile, the thicknesses T1 and T2 of the first insulating structures 150 and the second insulating structures 155 are decreased. In FIG. 1K, the height H4 is greater than the height H5, and the thickness T1 is less than the thickness T2.

According to the aforementioned embodiments, a plurality of removing cycles are performed to recess the first insulating structures and the second insulating structures. The removing cycle includes forming sacrificial layers on the first insulating structures and the second insulating structures and removing the sacrificial layers. After the first insulating structures and the second insulating structures are recessed, the first semiconductor fins and the second semiconductor fins can protrude from the first insulating structures and the second insulating structures. Hence, the heights of the protruding portions of the semiconductor fins (and also the thickness of the insulating structure) can be tuned by determining the number of the removing cycles. For example, the height of the protruding portion of the semiconductor fin of an N-type FinFET can be different from the height of the protruding portion of the semiconductor fin of a P-type FinFET due to the different etching rate of the first insulating structures and the second insulating structures. Alternately, the heights thereof can be tuned by performing different numbers of the removing cycles.

It is noted that although in FIGS. 1I-1K, the first insulating structures 150 and the second insulating structures 155 are recessed (or etched) in the same manufacturing process, the first insulating structures 150 and the second insulating structures 155 can be are recessed (or etched) separately in some other embodiments.

Figure 1L:
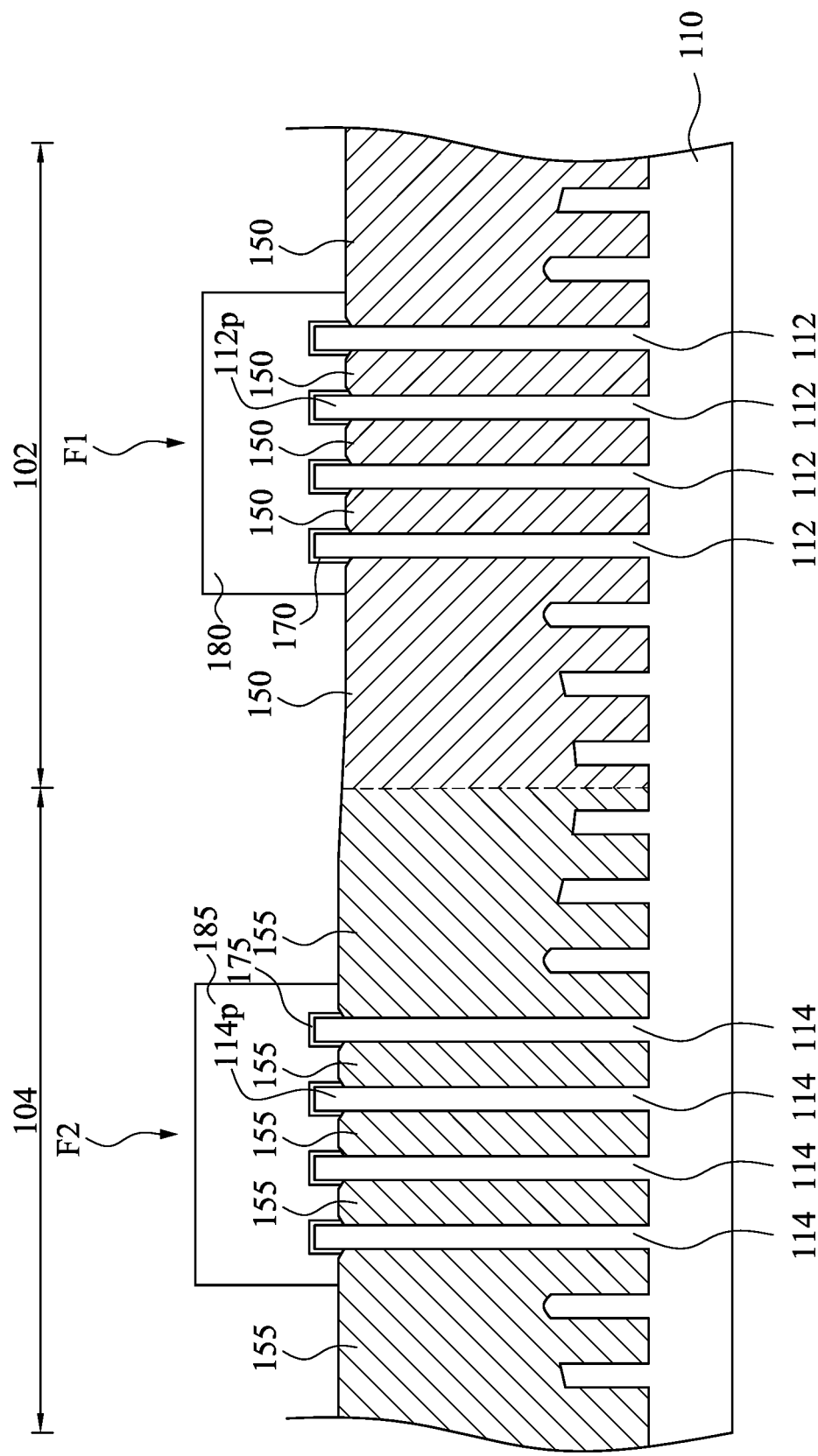

Reference is made to FIG. 1L. Gate dielectrics 170 and 175 are formed to cover the first protrusion portions 112$p$ of the first active semiconductor fins 112 and the second protrusion portions 114$p$ of the second active semiconductor fins 114, respectively. The gate dielectrics 170 and 175 may be formed by thermal oxidation, and hence may include thermal silicon oxide. Gate electrodes 180 and 185 are then formed on the gate dielectrics 170 and 175, respectively. In some embodiments, the gate electrode 180 covers more than one of the first active semiconductor fins 112 to form an n-type FinFET F1, and the gate electrode 185 covers more than one of the second active semiconductor fins 114 to form a p-type FinFET F2. In alternative embodiments, at least one of the first active semiconductor fins 112 and/or the second active semiconductor fins 114 may be used to form one FinFET.

Figure 2A:
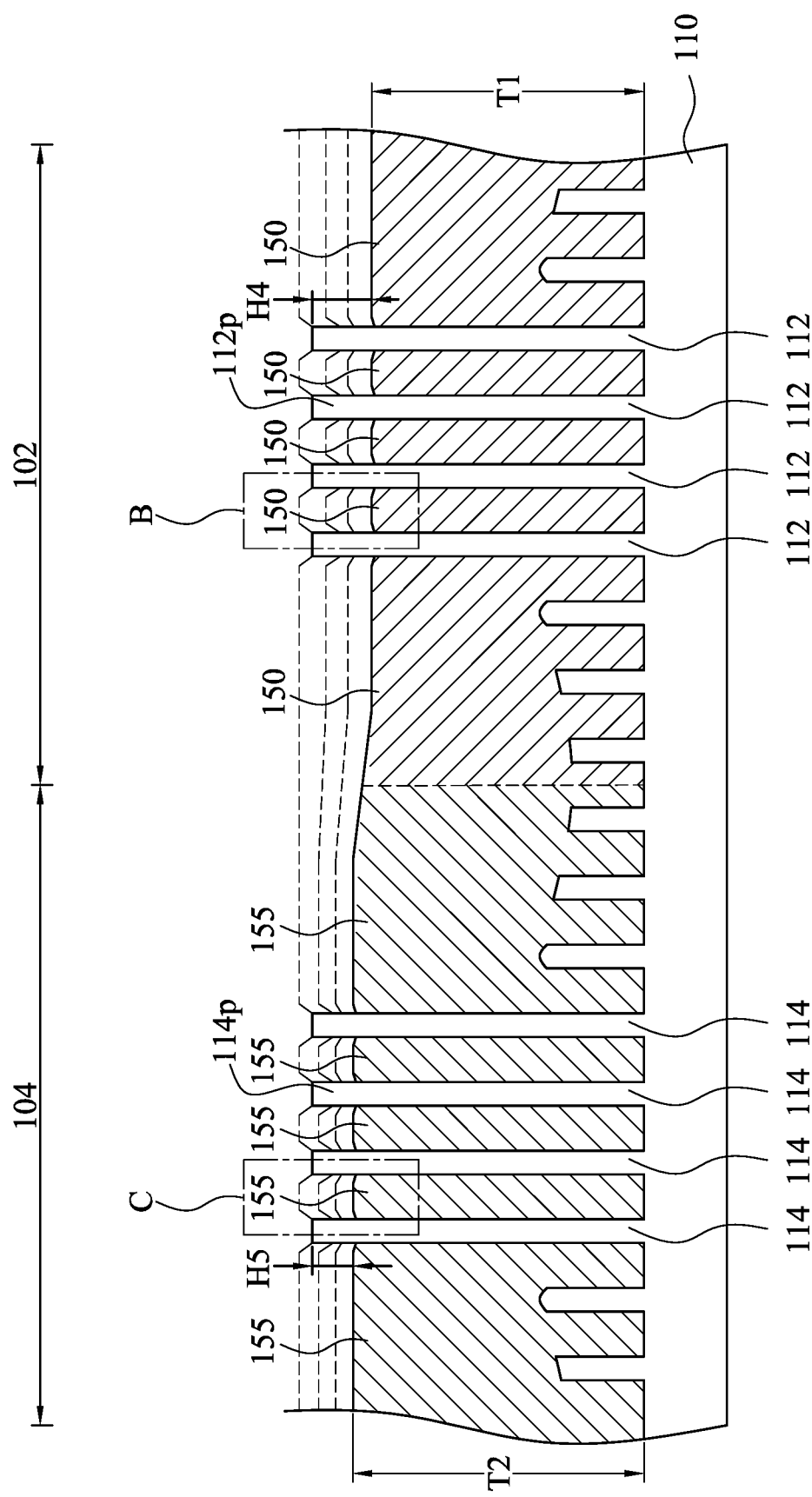
FIG. 2A is a cross-sectional view of a semiconductor structure in accordance with some embodiments of the present disclosure.

FIG. 2A is a cross-sectional view of a semiconductor structure in accordance with some embodiments of the present disclosure, FIG. 2B is an enlarged view of area B of FIG. 2A, and FIG. 2C is an enlarged view of area C of FIG. 2A. The difference between the semiconductor structure of FIG. 2A and FIG. 1K pertains to the number of the removing cycles. In FIG. 2A, three removing cycles are performed. The dashed lines in FIGS. 2A-2C represent the top surfaces of the first insulating structures 150 and the second insulating structures 155 before the third removing cycle is performed. In greater detail, taking the first insulating structures 150 as an example (see FIG. 2B), the first insulating structures 150 have the top surfaces 152$a$ before the first removing cycle is performed, the first insulating structures 150 have the top surfaces 152$b$ after the first removing cycle is performed, and the first insulating structures 150 have the top surfaces 152$c$ after the second removing cycle is performed. Moreover, the first insulating structures 150 have the top surfaces 152$d$ after the third removing cycle is performed. While increasing the number of the removing cycles, the height H4 of the protruding portions 112$p$ of the first active semiconductor fins 112 are increased, and the thickness T1 (see FIG. 2A) of the first insulating structures 150 is decreased.

In some embodiments, the height difference between the top surfaces 152$a$ and 152$b$ is about 10 nm, the height difference between the top surfaces 152$b$ and 152$c$ is about 8 nm, the height difference between the top surfaces 152$c$ and 152$d$ is about 5 nm, and the claimed scope of the present disclosure is not limited in this respect. Moreover, the top surfaces 152$b$, 152$c$, 152$d$ are convex. Two recesses 154$d$ are formed at the edge portions 151 of the first insulating structures 150. Furthermore, at least one of the recesses 154$d$ has at least one bottom surface 153$d$ extending downwardly from the top surface 152$d$ of the first insulating structure 150 to the first active semiconductor fin 112.

Similarly, in FIG. 2C, the second insulating structures 155 have the top surfaces 157$a$ before the second removing cycle is performed, the second insulating structures 155 have the top surfaces 157$b$ after the second removing cycle is performed, and the second insulating structures 155 have the top surfaces 157$c$ after the second removing cycle is performed. Moreover, the second insulating structures 155 have the top surfaces 157$d$ after the third removing cycle is performed. While increasing the number of the removing cycles, the height H5 of the protruding portions 114$p$ of the second active semiconductor fins 114 are increased, and the thickness T2 (see FIG. 2A) of the second insulating structures 155 is decreased. Moreover, the top surfaces 157$b$, 157$c$, 157$d$ are convex. Two recesses 159$d$ are formed at the edge portions 156 of the second insulating structures 155. Furthermore, at least one of the recesses 159$d$ has at least one bottom surface 158$d$ extending downwardly from the top surface 157$d$ of the second insulating structure 155 to the second active semiconductor fin 114. Other relevant structural and manufacturing details of the semiconductor structure of FIG. 2A are similar to the semiconductor structure of FIG. 1K, and, therefore, a description in this regard will not be repeated hereinafter.

Figure 3A:
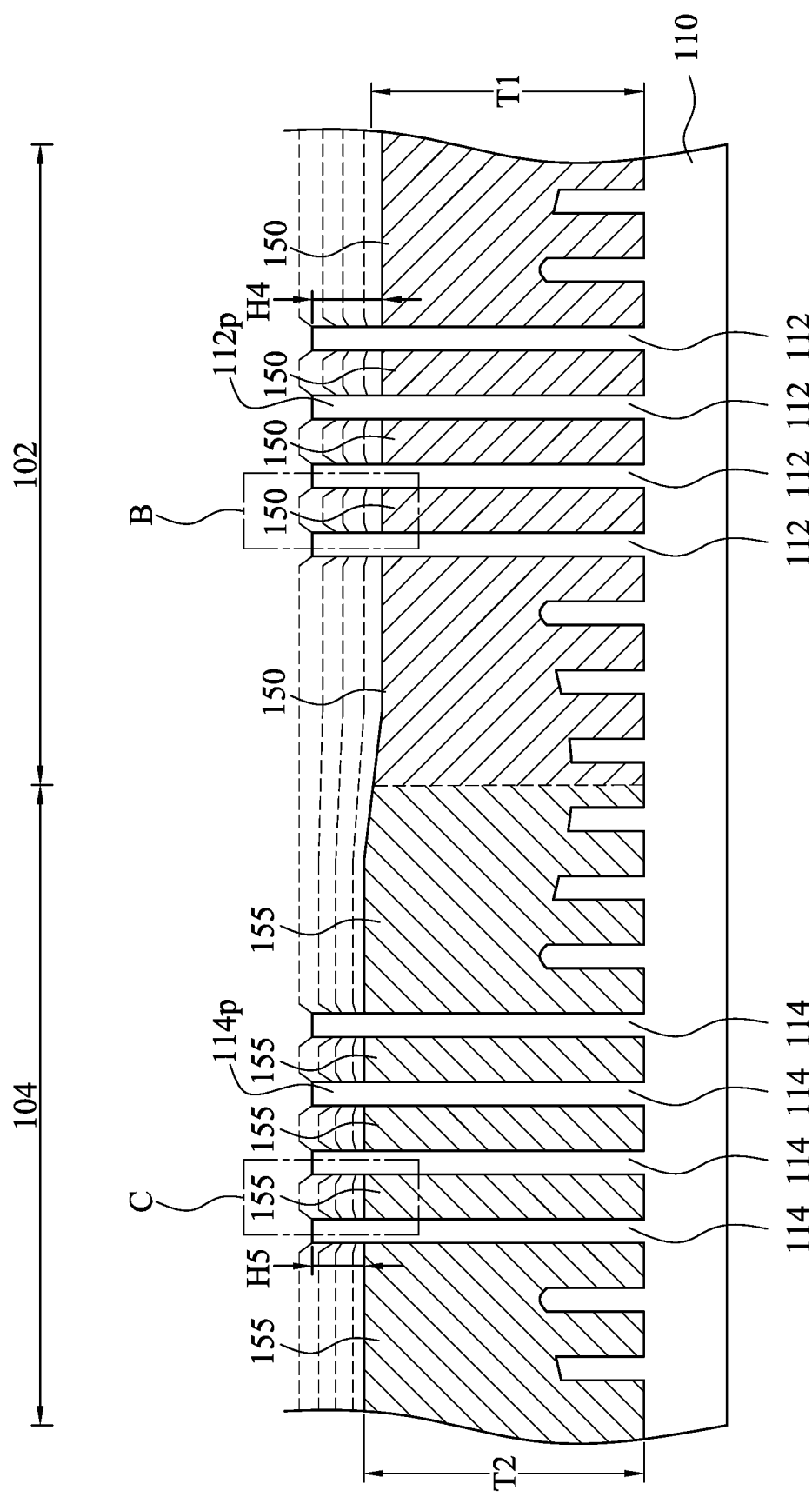
FIG. 3A is a cross-sectional view of a semiconductor structure in accordance with some embodiments of the present disclosure.

FIG. 3A is a cross-sectional view of a semiconductor structure in accordance with some embodiments of the present disclosure, FIG. 3B is an enlarged view of area B of FIG. 3A, and FIG. 3C is an enlarged view of area C of FIG. 3A. The difference between the semiconductor structure of FIG. 3A and FIG. 1K pertains to the number of the removing cycles. In FIG. 3A, four removing cycles are performed. The dashed lines in FIGS. 3A-3C represent the top surfaces of the first insulating structures 150 and the second insulating structures 155 before the fourth removing cycle is performed. In greater detail, taking the first insulating structures 150 as an example (see FIG. 3B), the first insulating structures 150 have the top surfaces 152$a$ before the first removing cycle is performed, the first insulating structures 150 have the top surfaces 152$b$ after the first removing cycle is performed, the first insulating structures 150 have the top surfaces 152$c$ after the second removing cycle is performed, and the first insulating structures 150 have the top surfaces 152$d$ after the second removing cycle is performed. Moreover, the first insulating structures 150 have the top surfaces 152$e$ after the fourth removing cycle is performed. While increasing the number of the removing cycles, the height H4 of the protruding portions 112$p$ of the first active semiconductor fins 112 are increased, and the thickness T1 (see FIG. 3A) of the first insulating structures 150 is decreased.

In some embodiments, the height difference between the top surfaces 152$a$ and 152$b$ is about 10 nm, the height difference between the top surfaces 152$b$ and 152$c$ is about 8 nm, the height difference between the top surfaces 152$c$ and 152$d$ is about 5 nm, the height difference between the top surfaces 152$d$ and 152$e$ is about 4 nm, and the claimed scope of the present disclosure is not limited in this respect. Moreover, the top surfaces 152$b$, 152$c$, 152$d$ are convex, and the top surface 152$e$ is substantially flat.

Similarly, in FIG. 3C, the second insulating structures 155 have the top surfaces 157$a$ before the second removing cycle is performed, the second insulating structures 155 have the top surfaces 157$b$ after the second removing cycle is performed, the second insulating structures 155 have the top surfaces 157$c$ after the second removing cycle is performed, and the second insulating structures 155 have the top surfaces 157$d$ after the third removing cycle is performed. Moreover, the second insulating structures 155 have the top surfaces 157$e$ after the fourth removing cycle is performed. While increasing the number of the removing cycles, the height H5 of the protruding portions 114$p$ of the second active semiconductor fins 114 are increased, and the thickness T2 (see FIG. 3A) of the second insulating structures 155 is decreased. Moreover, the top surfaces 157b, 157c, 157d are convex, and the top surface 157e is substantially flat. Other relevant structural and manufacturing details of the semiconductor structure of FIG. 3A are similar to the semiconductor structure of FIG. 1K, and, therefore, a description in this regard will not be repeated hereinafter.

According to the aforementioned embodiments, the top surface profile can be changed when the number of the removing cycles is increased. Therefore, the top surface profile of the first insulating structures and the second insulating structures can also be tuned (e.g., convex or substantially flat) by determining the number of the removing cycles. Since the top surfaces of the first insulating structures and the second insulating structures are non-concave, the sidewall of the first active semiconductor fins and the second active semiconductor fins can be further exposed, and the parasitic capacitance of the semiconductor device can be improved. Also, the performance (e.g., the on/off current) of the semiconductor structure can be adjust by tuning the height of the protruding portion of the semiconductor fin, the thickness of the insulating structure, and/or the top surface profile of the insulating structure.

Moreover, since the first insulating structure and the second insulating structure include different dopants, the etching rates of the first insulating structures and the second insulating structures are different. The height of the first protrusion portion of the first active semiconductor fin is different from the height of the second protrusion portion of the second active semiconductor fin. That is, with at least one etching process, active semiconductor fins with different heights can be formed. By differentiating fin heights in different device regions, the junction window is increased, which means that the fin heights of FinFETs in different device regions are no longer tied together. With the FinFETs in different device regions having different fin heights, it is easier to tune the performance of devices in different device regions.

According to some embodiments, a semiconductor device includes a substrate, a FinFET, and an insulating structure. The FinFET includes a fin, a gate electrode, and a gate dielectric layer. The fin is over the substrate. The gate electrode is over the fin. The gate dielectric layer is between the gate electrode and the fin. The insulating structure is over the substrate, adjacent the fin, and has a top surface lower than a top surface of the fin. The top surface of the insulating structure has opposite first and second edge portions and an intermediate portion between the first and second edge portions. The first edge portion of the top surface of the insulating structure is lower than the intermediate portion of the top surface of the insulating structure.

According to some embodiments, a semiconductor device includes a substrate, a first FinFET, a second FinFET, a first insulating structure, and a second insulating structure. The first FinFET includes a first fin, a first gate electrode, and a first gate dielectric layer. The first fin is over a first region of the substrate. The first gate electrode is over the first fin. The first gate dielectric layer is between the first gate electrode and the first fin. The second FinFET includes a second fin, a second gate electrode, and a second gate dielectric layer. The second fin is over a second region of the substrate. The second gate electrode is over the second fin. The second gate dielectric layer is between the second gate electrode and the second fin. The first insulating structure is over the first region of the substrate, adjacent the first fin, and has a top surface lower than a top surface of the first fin. The second insulating structure is over the second region of the substrate, adjacent the second fin, and has a top surface lower than a top surface of the second fin. The top surface of the second insulating structure is higher than the top surface of the first insulating structure.

According to some embodiments, a semiconductor device includes a substrate, a first FinFET, and a second FinFET. The first FinFET includes a first fin, a first gate electrode, and a first gate dielectric layer. The first fin is over a first region of the substrate. The first gate electrode is over the first fin. The first gate electrode is over the first fin. The first gate dielectric layer is between the first gate electrode and the first fin. The second FinFET includes a second fin, a second gate electrode, and a second gate dielectric layer. The second fin is over a second region of the substrate. The second gate electrode is over the second fin. The second gate dielectric layer is between the second gate electrode and the second fin. A bottom of the first gate dielectric layer is lower than a bottom of the second gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a first fin field-effect transistor (FinFET) comprising:
      a first fin over the substrate;
      a first gate electrode over the first fin; and
      a first gate dielectric layer between the first gate electrode and the first fin;
   a second fin field-effect transistor (FinFET) comprising:
      a second fin over the substrate;
      a second gate electrode over the second fin; and
      a second gate dielectric layer between the second gate electrode and the second fin; and
   an insulating structure over the substrate, adjacent the first and second fins, and having a top surface lower than a top surface of the first and second fins, wherein the top surface of the insulating structure has opposite first and second edge portions and an intermediate portion between the first and second edge portions, the first edge portion of the top surface of the insulating structure is in contact with the first fin, the second edge portion of the top surface of the insulating structure is in contact with the second fin, and the first edge portion of the top surface of the insulating structure is higher than the second edge portion of the top surface of the insulating structure.

2. The semiconductor device of claim 1, wherein the second edge portion of the top surface of the insulating structure is lower than the intermediate portion of the top surface of the insulating structure.

3. The semiconductor device of claim 1, wherein the first edge portion of the top surface of the insulating structure extends downwards from the intermediate portion of the top surface of the insulating structure toward a first sidewall of the insulating structure.

4. The semiconductor device of claim 3, wherein the second edge portion of the top surface of the insulating structure extends downwards from the intermediate portion of the top surface of the insulating structure toward a second sidewall of the insulating structure.

5. The semiconductor device of claim 1, wherein the insulating structure includes dopants therein.

6. A semiconductor device comprising:
a substrate;
a first fin field-effect transistor (FinFET) comprising:
   a first fin over a first region of the substrate;
   a first gate electrode over the first fin; and
   a first gate dielectric layer between the first gate electrode and the first fin;
a second FinFET comprising:
   a second fin over a second region of the substrate;
   a second gate electrode over the second fin; and
   a second gate dielectric layer between the second gate electrode and the second fin;
a first insulating structure over the first region of the substrate, adjacent the first fin, and having a topmost surface lower than a topmost surface of the first fin, wherein the topmost surface of the first insulating structure is convex; and
a second insulating structure over the second region of the substrate, adjacent the second fin, and having a topmost surface lower than a topmost surface of the second fin, wherein the topmost surface of the second insulating structure is higher than the topmost surface of the first insulating structure.

7. The semiconductor device of claim 6, wherein the first insulating structure includes p-type dopants therein.

8. The semiconductor device of claim 6, wherein the second insulating structure includes n-type dopants therein.

9. The semiconductor device of claim 6, wherein the topmost surface of the second insulating structure is convex.

10. The semiconductor device of claim 6, further comprising a third fin between the first and second fins, wherein a height of the third fin from the substrate is less than a height of the first fin from the substrate.

11. The semiconductor device of claim 6, wherein the first fin and the second fin have substantially the same height from the substrate.

12. The semiconductor device of claim 6, wherein the first insulating structure is between the first fin and the second fin.

13. The semiconductor device of claim 6, wherein the second insulating structure is between the first fin and the second fin.

14. A semiconductor device comprising:
a substrate;
a first fin field-effect transistor (FinFET) comprising:
   a first fin over a first region of the substrate;
   a first gate electrode over the first fin; and
   a first gate dielectric layer between the first gate electrode and the first fin and in contact with the first fin;
a first insulating structure laterally surrounding the first fin;
a second FinFET comprising:
   a second fin over a second region of the substrate;
   a second gate electrode over the second fin; and
   a second gate dielectric layer between the second gate electrode and the second fin and in contact with the second fin, wherein a bottom of the first gate dielectric layer is lower than a bottom of the second gate dielectric layer;
a second insulating structure laterally surrounding the second fin, wherein an interface between the first insulating structure and the first gate dielectric layer is lower than an interface between the second insulating structure and the second gate dielectric layer; and
a third fin embedded in the first insulating structure, wherein a portion of a top surface of the first insulating structure directly above the third fin is inclined with respect to a bottom surface of the first insulating structure.

15. The semiconductor device of claim 14, wherein a bottom of the first gate electrode is lower than a bottom of the second gate electrode.

16. The semiconductor device of claim 14, wherein the first FinFET is an n-type FinFET.

17. The semiconductor device of claim 14, wherein the second FinFET is a p-type FinFET.

18. The semiconductor device of claim 14, wherein:
the first insulating structure has a top surface lower than a top surface of the first fin; and
the second insulating structure has a top surface lower than a top surface of the second fin, wherein the first insulating structure and the second insulating structure include different dopants therein.

19. The semiconductor device of claim 14, wherein the interface between the second insulating structure and the second gate dielectric layer is inclined with respect to a bottom surface of the second insulating structure.

20. The semiconductor device of claim 14, wherein a top surface of the first insulating structure is convex.

* * * * *